US012666831B2

(12) United States Patent
Lee

(10) Patent No.: US 12,666,831 B2
(45) Date of Patent: Jun. 23, 2026

(54) DISPLAY DEVICE

(71) Applicant: Samsung Display Co., LTD., Yongin-si (KR)

(72) Inventor: Kang-Yong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 18/334,508

(22) Filed: Jun. 14, 2023

(65) Prior Publication Data

US 2024/0122008 A1     Apr. 11, 2024

(30) Foreign Application Priority Data

Oct. 7, 2022    (KR) ........................ 10-2022-0128818

(51) Int. Cl.
| | |
|---|---|
| *H10K 59/131* | (2023.01) |
| *H10K 59/123* | (2023.01) |
| *H10K 59/80* | (2023.01) |
| *H10K 102/00* | (2023.01) |

(52) U.S. Cl.
CPC ......... *H10K 59/131* (2023.02); *H10K 59/123* (2023.02); *H10K 59/8722* (2023.02); *H10K 2102/311* (2023.02)

(58) Field of Classification Search
CPC .............. H10K 59/131; H10K 59/123; H10K 59/8722; H10K 2102/311; H10K 59/12; H10K 77/111; H10K 50/844; H10K 50/84; H10K 50/11; H10K 50/81; G06F 1/1652; G09F 9/301
See application file for complete search history.

(56) References Cited

U.S. PATENT DOCUMENTS

| | | | |
|---|---|---|---|
| 9,349,969 B2 | 5/2016 | Kwon et al. | |
| 2018/0248141 A1* | 8/2018 | Nishimura | ........... H10K 59/122 |
| 2020/0150481 A1* | 5/2020 | You | ........... H10K 77/111 |
| 2021/0408475 A1* | 12/2021 | Moon | ........... H10K 59/121 |
| 2022/0374058 A1* | 11/2022 | Kim | ........... G06F 1/203 |

FOREIGN PATENT DOCUMENTS

| | | | | |
|---|---|---|---|---|
| CN | 109148380 | | 2/2021 | |
| CN | 109087586 | | 5/2021 | |
| CN | 114283688 | | 4/2022 | |
| EP | 3282498 | A1 * | 2/2018 | ........... H10K 59/873 |

* cited by examiner

*Primary Examiner* — Elmito Breval

(74) *Attorney, Agent, or Firm* — Sughrue Mion, PLLC

(57) ABSTRACT

A display device includes a display panel including a display area, a pad area spaced apart from a display area, and a bending area located between a display area and a pad area and bent from a display area, a protective film disposed under a display panel, having an opening exposing a portion of a lower surface of a display panel, and overlapping a display area and a pad area in a plan view, a first adhesive layer disposed under a display panel and a protective film, integrally formed to overlap a display area, a pad area, and a bending area in a plan view, and covering an opening, and, a cushion layer disposed under a first adhesive layer, integrally formed to overlap a display area, a pad area, and a bending area in a plan view, and covering an opening.

20 Claims, 9 Drawing Sheets

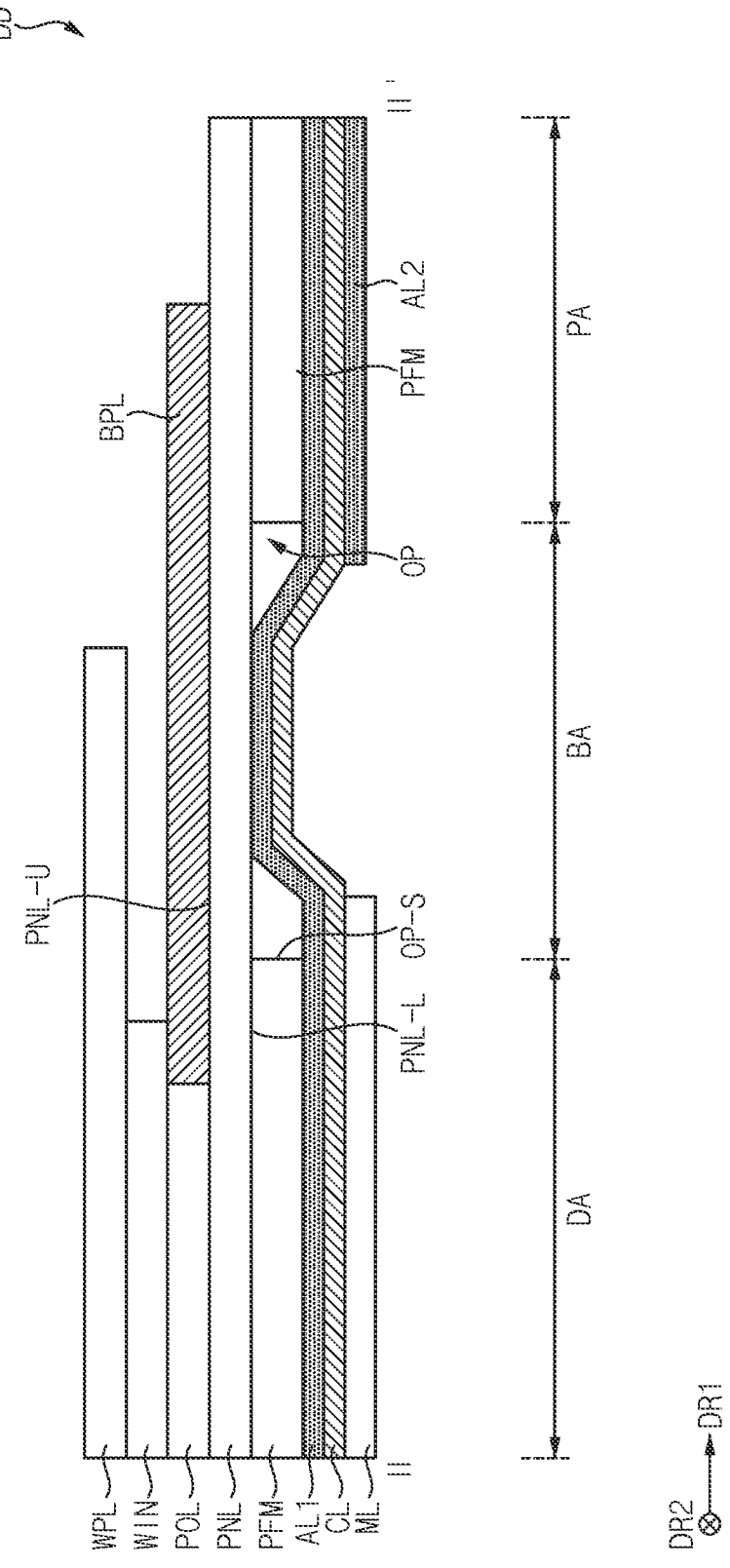
F I G . 4

PNL-U

BPL

WPL
WIN
POL
PNL
PFM
AL1
CL
ML
II

PFM    AL2

OP

PNL-L    OP-S

II'

DA        BA        PA

DR2 ⊗ → DR1

DISPLAY DEVICE

CROSS-REFERENCE TO RELATED APPLICATION

This application claims priority to and benefits of Korean Patent Application No. 10-2022-0128818 under 35 U.S.C. § 119, filed in the Korean Intellectual Property Office on Oct. 7, 2022, the entire contents of which are incorporated herein by reference.

BACKGROUND

1. Technical Field

Embodiments of the disclosure relate to a display device having improved durability and workability in a manufacturing process thereof.

2. Description of the Related Art

As information technology develops, importance of display devices, which are communication media between users and information, is being highlighted. Accordingly, use of display devices such as liquid crystal display devices, organic light emitting display devices, plasma display devices, or the like is increasing.

Meanwhile, by bending at least a portion of the display device, visibility at various angles may be improved or an area of the non-display area may be reduced. In the process of manufacturing such a display device in which at least a portion is bent, a method of minimizing defects has been sought.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

Embodiments provide a display device having improved durability and workability in a manufacturing process thereof.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment includes a display panel including a display area, a pad area spaced apart from the display area, and a bending area located between the display area and the pad area and bent from the display area, a protective film disposed under the display panel, having an opening exposing a portion of a lower surface of the display panel, and overlapping the display area and the pad area in a plan view, a first adhesive layer disposed under the display panel and the protective film, integrally formed to overlap the display area, the pad area, and the bending area in a plan view, and covering the opening, and, a cushion layer disposed under the first adhesive layer, integrally formed to overlap the display area, the pad area, and the bending area in a plan view, and covering the opening.

In an embodiment, the opening may overlap the bending area in a plan view.

In an embodiment, a portion of the first adhesive layer may be disposed in the opening.

In an embodiment, a portion of the cushion layer may be disposed in the opening.

In an embodiment, the first adhesive layer may contact the lower surface of the display panel in the opening.

In an embodiment, the first adhesive layer may be spaced apart from an inner surface of the opening.

In an embodiment, the first adhesive layer may contact an inner surface of the opening.

In an embodiment, the first adhesive layer may entirely cover the inner surface of the opening and the lower surface of the display panel in the opening.

In an embodiment, the first adhesive layer and the cushion layer may have flexibility.

In an embodiment, a thickness of the cushion layer may be in a range of about 50 micrometers to about 90 micrometers.

In an embodiment, a thickness of the first adhesive layer may be in a range of about 10 micrometers to about 50 micrometers.

In an embodiment, the display device may further include a second adhesive layer disposed under the cushion layer and overlapping the pad area in a plan view.

In an embodiment, a thickness of the second adhesive layer may be in a range of about 10 micrometers to about 50 micrometers.

In an embodiment, the display device may further include a metal layer disposed under the cushion layer and overlapping the display area in a plan view.

In an embodiment, the second adhesive layer may contact the metal layer in a bent state of the bending area.

In an embodiment, the display device may further include a filling member disposed under the cushion layer and overlapping the bending area in a plan view.

In an embodiment, the filling member may overlap the opening in a plan view.

In an embodiment, the filling member and the cushion layer may include a same material.

In an embodiment, the display device may further include a pad part disposed on an upper surface opposite to the lower surface of the display panel and overlapping the pad area in a plan view.

In an embodiment, the display panel may include a transistor electrically connected to the pad part, a pixel electrode disposed on the transistor and electrically connected to the transistor, an emission layer disposed on the pixel electrode, a common electrode disposed on the emission layer, and an encapsulation layer disposed on the common electrode and including at least one inorganic encapsulation layer and at least one organic encapsulation layer.

The display device according to embodiments may include the display panel, the protective film disposed under the display panel, the first adhesive layer disposed under the protective film, and the cushion layer disposed under the adhesive layer. The protective film may have the opening exposing a portion of the lower surface of the display panel. Each of the first adhesive layer and the cushion layer may be integrally formed to overlap the display area, the bending area, and the pad area in a plan view, and may cover the opening. For example, a portion of the first adhesive layer and a portion of the cushion layer may be disposed in the opening in the bending area. Accordingly, durability of the display panel in the bending area may be improved. Accordingly, durability of the display device may be improved.

As the first adhesive layer and the cushion layer cover the opening in the bending area, a separate process for filling the opening may not be required. Thus, efficiency of the manufacturing process of the display device may be improved.

It is to be understood that both the foregoing general description and the following detailed description are intended to provide further explanation of the disclosure as claimed.

BRIEF DESCRIPTION OF THE DRAWINGS

An additional appreciation according to the embodiments will become more apparent by describing in detail the embodiments thereof with reference to the accompanying drawings, wherein:

FIG. 4 is a schematic cross-sectional view taken along line II-IT' of FIG. 1;

FIG. 6 is a schematic cross-sectional view illustrating a display device according to another embodiment;

DETAILED DESCRIPTION OF THE EMBODIMENTS

Figure 1:
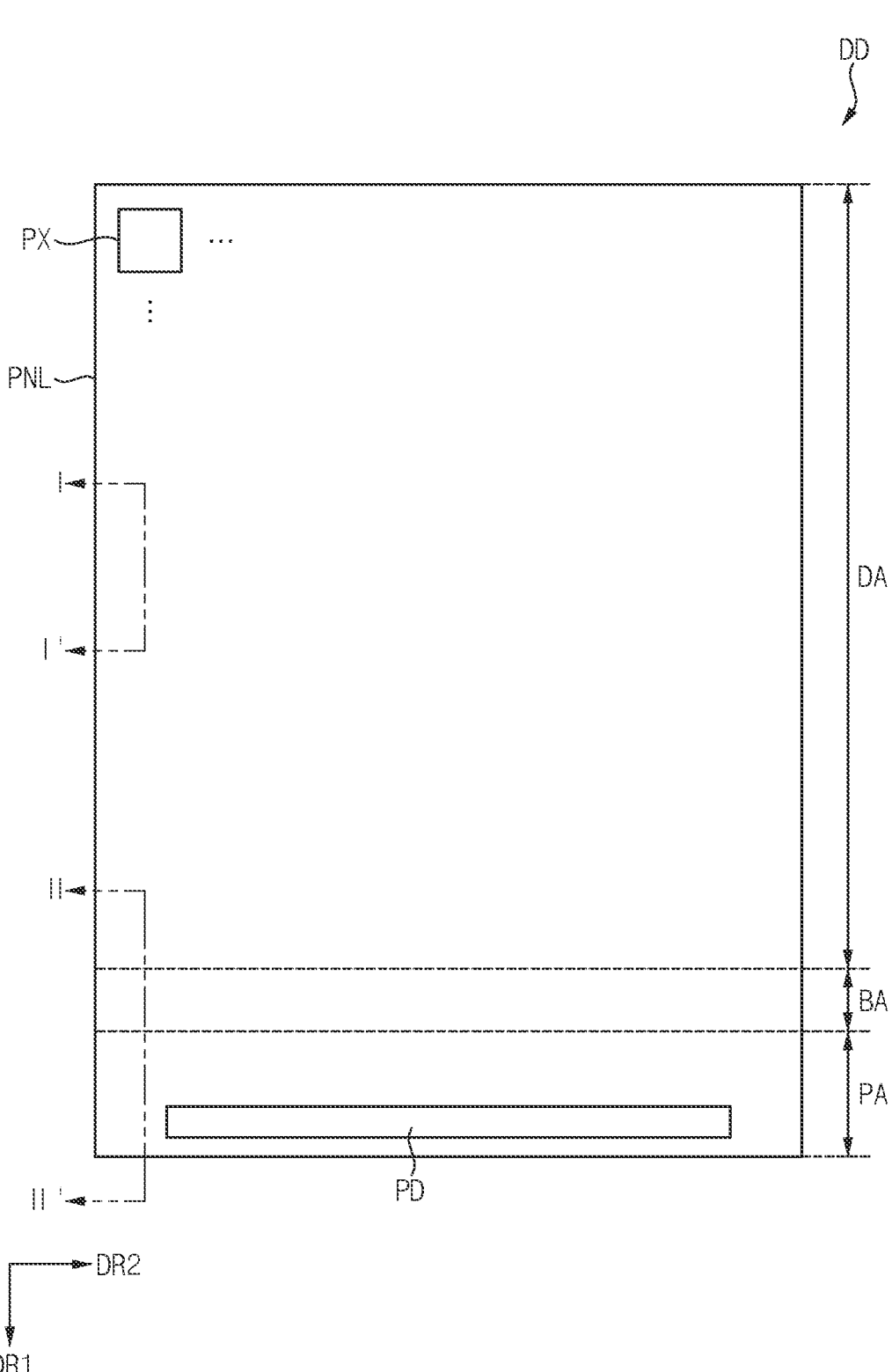
FIG. 1 is a schematic plan view illustrating a display device according to an embodiment.

The disclosure now will be described more fully hereinafter with reference to the accompanying drawings, in which various embodiments are shown. This disclosure may, however, be embodied in many different forms, and should not be construed as limited to the embodiments set forth herein. Rather, these embodiments are provided so that this disclosure will be more thorough and complete, and will convey the scope of the disclosure to those skilled in the art.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
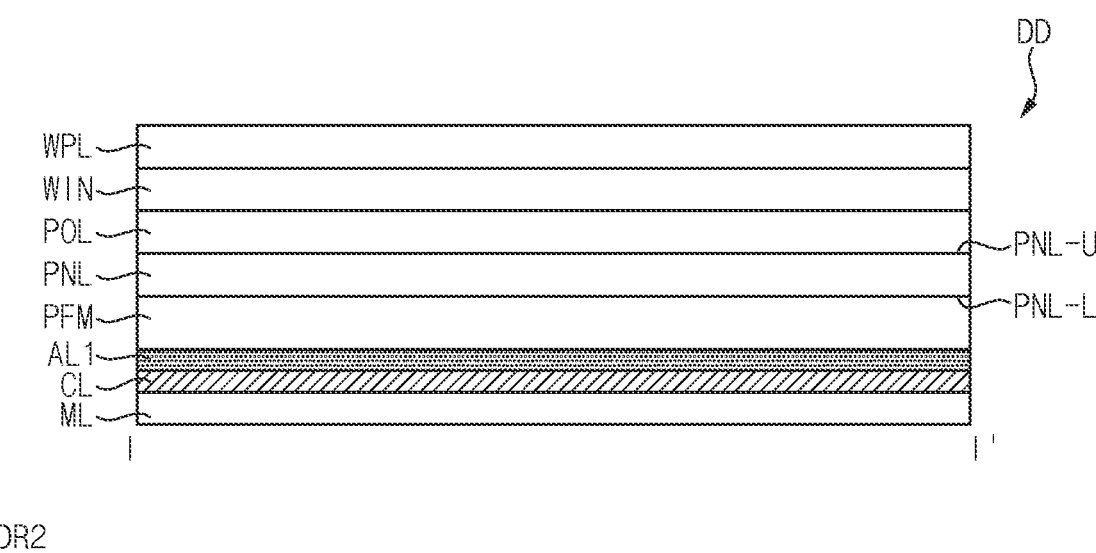
FIG. 2 is a schematic cross-sectional view taken along line I-I' of FIG. 1.

FIG. 1 is a schematic plan view illustrating a display device according to an embodiment, and FIG. 2 is a schematic cross-sectional view taken along line I-I' of FIG. 1.

Referring to FIG. 1, a display device DD according to an embodiment may include a display panel PNL, an anti-reflection layer POL, a window WIN, a window protective layer WPL, a protective film PFM, a first adhesive layer AL1, a cushion layer CL and a metal layer ML.

The display device DD may display an image. For example, the display device DD may be an organic light emitting display. However, a type of the display device DD is not limited thereto and may be a display device of various types that may be bent.

The display device DD (e.g., the display panel PNL) may include a display area DA, a pad area PA, and a bending area BA.

At least one pixel structure PX may be disposed in the display area DA, and an image may be displayed through the pixel structure PX in the display area DA. The pixel structure PX may include a driving device (e.g., a transistor) and a light emitting device (e.g., an organic light emitting diode) electrically connected to the driving device. The light emitting device may receive a signal and/or voltage from the driving device and emit light. For example, the driving device may provide a driving current to the light emitting device, and the light emitting device may generate light having a luminance corresponding to the driving current. The pixel structure PX may be disposed in the display area DA. For example, the pixel structure PX may be arranged in a matrix form in the display area DA.

Figure 5:
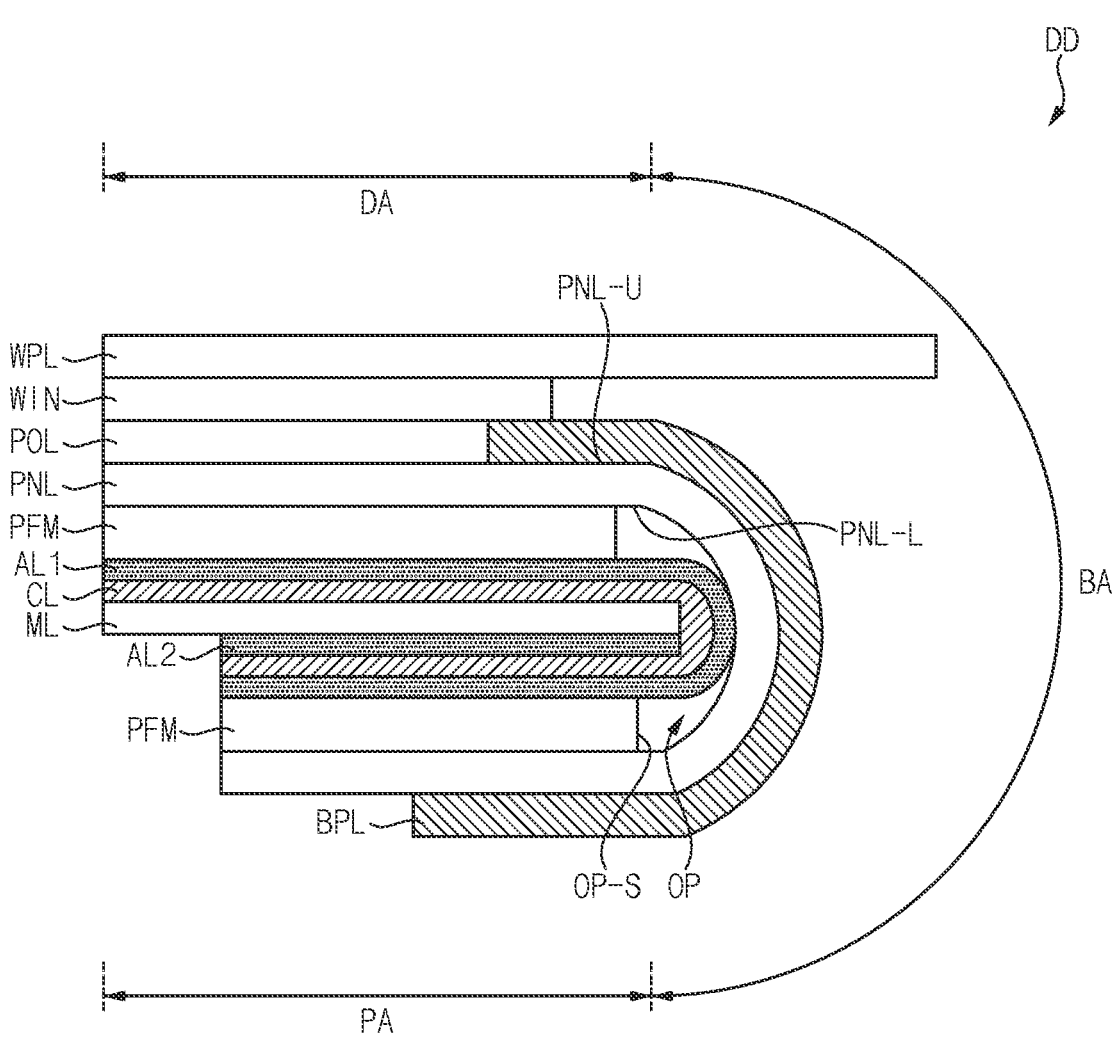
FIG. 5 is a schematic cross-sectional view illustrating a bent state of the display device of FIG. 4.
Figure 5:
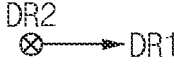

The pad area PA may be disposed on a side of the display area DA and may be spaced apart from the display area DA. For example, the pad area PA may be spaced apart from the display area DA in a first direction DR1. Various electronic devices such as an integrated circuit (IC) or a printed circuit board (PCB) may be electrically attached to the pad area PA. For example, a pad part PD may be disposed in the pad area PA. The pad part PD may include multiple pads, and the pads may receive electrical signals from outside. The bending area BA may be located between the display area DA and the pad area PA. For example, as shown in FIG. 5, the bending area BA may be bent based on a virtual bending axis extending in a second direction DR2 intersecting the first direction DR1. Accordingly, the display device DD (e.g., the display panel PNL) may be bent.

In FIG. 1, each of the display area DA, the bending area BA, and the pad area PA is illustrated as having a rectangular planar shape, but the disclosure is not limited thereto.

The anti-reflection layer POL may be disposed on an upper surface PNL-U of the display panel PNL. The anti-reflection layer POL may be disposed on the display panel PNL. The anti-reflection layer POL may reduce reflection of external light of the display device DD. For example, in case that the external light passes through the anti-reflection layer POL and is reflected from a lower part of the anti-reflection layer POL (e.g., display panel PNL) to pass through the anti-reflection layer POL again, a phase of the external light may change. Accordingly, since a phase of the reflected light is different from a phase of the incident light entering the anti-reflection layer POL, destructive interference may occur between the reflected light and the incident light. Thus, reflection of the external light may be reduced and a visibility of the display device DD may be improved.

The window WIN may be disposed on the anti-reflection layer POL. The window WIN may overlap the display area DA of the display panel PNL in a plan view. The window WIN may protect the display panel PNL from external impurities, impact, or the like. In an embodiment, the window WIN may include a flexible transparent glass or a transparent plastic. For example, the window WIN may include ultra-thin glass (UTG) or polyimide (PI). In case that the display device DD is bent, the flexible window WIN may also be bent. Although not shown in FIG. 2, functional layers such as an anti-reflection layer, a hard coating layer, and an anti-fingerprint layer may be disposed on the window WIN.

The window protective layer WPL may be disposed on the window WIN. The window protective layer WPL may protect the window WIN from external impurities, impact, or the like. For example, the window protective layer WPL may include polyethylene terephthalate (PET), thermoplastic polyurethane (TPU), polycarbonate (PC), or the like.

Adhesive layers may be disposed between the window protective layer WPL and the window WIN, between the window WIN and the anti-reflection layer POL, and between the anti-reflection layer POL and the display panel PNL, respectively. For example, each of the adhesive layers may include pressure sensitive adhesive (PSA), optically clear adhesive (OCA), optically clear resin (OCR), or the like.

The protective film PFM may be disposed on a lower surface PNL-L of the display panel PNL. The lower surface PNL-L of the display panel PNL may be opposite to the upper surface PNL-U of the display panel PNL. The protective film PFM may be disposed under the display panel PNL. The protective film PFM may absorb an external impact from a lower part of the display device DD. Accordingly, the protective film PFM may protect the lower surface PNL-L of the display panel PNL from external impact.

The cushion layer CL may be disposed under the protective film PFM. The cushion layer CL may be disposed under the display panel PNL and mitigate an impact of the display panel PNL. For example, the cushion layer CL may include a material capable of buffering by containing air. The cushion layer CL may include a cushion or a sponge. The cushion layer CL may include at least one of acrylic resin, polyurethane, thermoplastic polyurethane, latex, polyurethane foam, polystyrene foam, and the like. The cushion layer CL may have a foam shape or a gel shape. In an embodiment, a thickness of the cushion layer CL may be in a range of about 50 micrometers to about 90 micrometers.

For example, the thickness of the cushion layer CL may be in a range of about 70 micrometers to about 90 micrometers.

The first adhesive layer AL1 may be disposed between the protective film PFM and the cushion layer CL. The first adhesive layer AL1 may adhere (or attach) the protective film PFM and the cushion layer CL. The first adhesive layer AL1 may include at least one of pressure sensitive adhesive (PSA), optically clear adhesive (OCA), optically clear resin (OCR), and the like. In an embodiment, a thickness of the first adhesive layer AL1 may be in a range of about 10 micrometers to about 50 micrometers. For example, the thickness of the first adhesive layer AL1 may be in a range of about 30 micrometers to about 50 micrometers.

The metal layer ML may be disposed under the cushion layer CL. The metal layer ML may support the display panel PNL. For example, the metal layer ML may include at least one of invar, which is an alloy of nickel (Ni) and iron (Fe), stainless steel (SUS), titanium (Ti), copper (Cu), and the like.

Although not shown in FIG. 2, adhesive layers may be disposed between the display panel PNL and the protective film PFM and between the cushion layer CL and the metal layer ML. The adhesive layers may include at least one of pressure sensitive adhesive (PSA), optically clear adhesive (OCA), optically clear resin (OCR), and the like.

Figure 3:
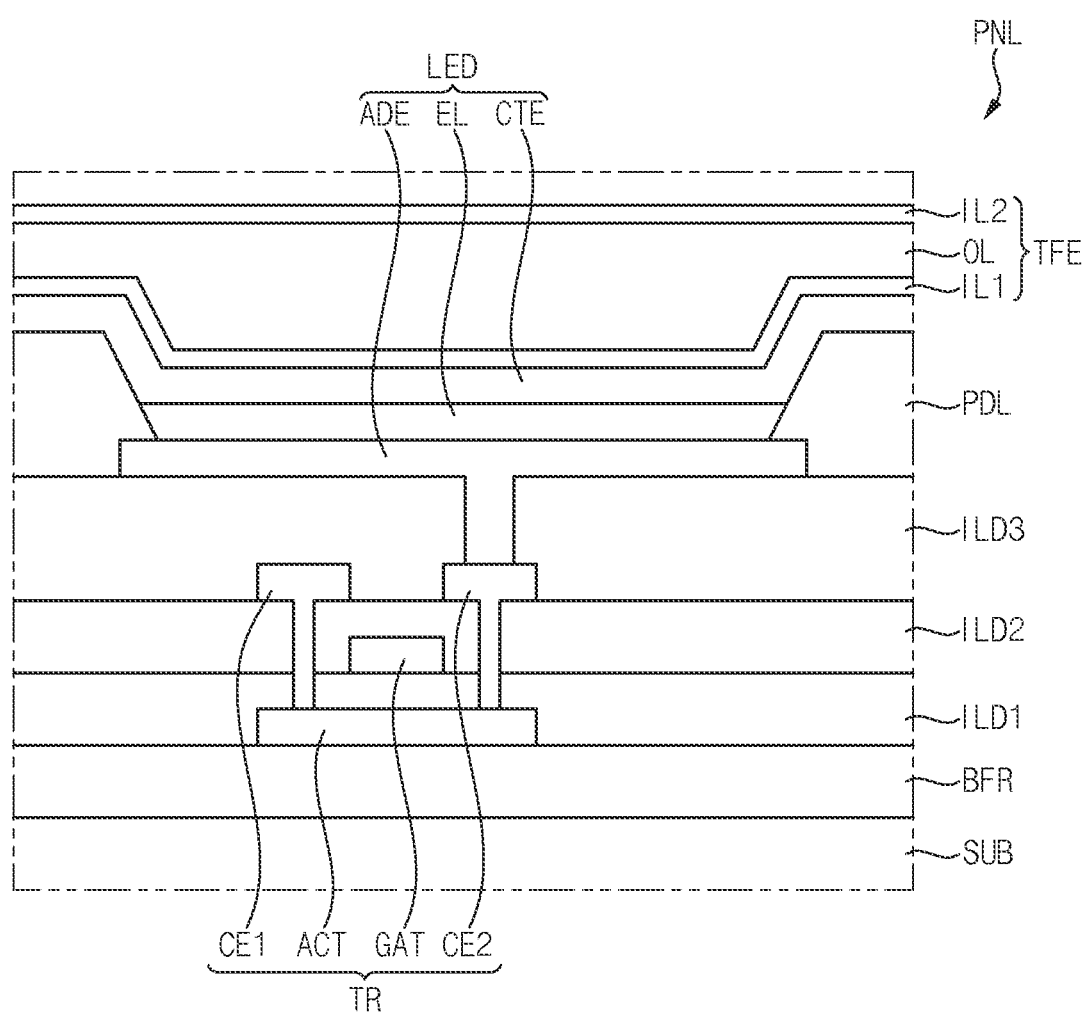
FIG. 3 is a schematic cross-sectional view illustrating a display panel included in the display device of FIG. 2.

FIG. 3 is a schematic cross-sectional view illustrating a display panel included in the display device of FIG. 2.

Referring to FIG. 3, the display panel PNL may include a substrate SUB, a buffer layer BFR, a transistor TR, a first insulating layer ILD1, a second insulating layer ILD2, a third insulating layer ILD3, a light emitting device LED, pixel defining layer PDL, and an encapsulation layer TFE. The transistor TR may include an active pattern ACT, a gate electrode GAT, a first connection electrode CE1, and a second connection electrode CE2. The transistor TR may be electrically connected to the pad part PD of FIG. 1. The light emitting device LED may include a pixel electrode ADE, an emission layer EL, and a common electrode CTE.

The substrate SUB may be formed of a transparent or opaque material. For example, the substrate SUB may include at least one of glass, quartz, plastic, and the like. Examples of plastics that may be used as the substrate SUB may include at least one of polyethylene terephthalate (PET), polyimide (PI), polyethersulfone (PS), polyacrylate (PAR), polyetherimide (PEI), polyethylene naphthalate. (PEN), polyphenylene sulfide (PPS), polyarylate, polycarbonate (PC), polyarylene ether sulfone, and the like. The substrate SUB may include multiple polyimide layers and barrier layers disposed between the polyimide layers.

The buffer layer BFR may be disposed on the substrate SUB. In an embodiment, the buffer layer BFR may include an inorganic material. For example, inorganic materials that may be used as the buffer layer BFR may include at least one of silicon oxide, silicon nitride, silicon oxynitride, and the like. These may be used alone or in combination with each other.

The buffer layer BFR may prevent diffusion of metal atoms or impurities from the substrate SUB into the active pattern ACT. Also, the buffer layer BFR may control a heat supply rate during a crystallization process for forming the active pattern ACT.

The active pattern ACT may be disposed on the buffer layer BFR. In an embodiment, the active pattern ACT may be a silicon semiconductor or an oxide semiconductor. For example, examples of materials that may be used as the active pattern ACT may include at least one of amorphous silicon, polycrystalline silicon, metal oxide, and the like. These may be used alone or in combination with each other.

The first insulating layer ILD1 may be disposed on the active pattern ACT. The first insulating layer ILD1 may be formed of an insulating material. Examples of an insulating material that may be used as the first insulating layer ILD1 may include at least one of silicon oxide, silicon nitride, silicon oxynitride, and the like. These may be used alone or in combination with each other. In an embodiment, as shown in FIG. 3, the first insulating layer ILD1 may be formed on (e.g., entirely on) the buffer layer BFR and cover the active pattern ACT. However, the disclosure is not limited thereto, and in another embodiment, the first insulating layer ILD1 may be disposed on the active pattern ACT in a pattern form.

The gate electrode GAT may be disposed on the first insulating layer ILD1 and may overlap the active pattern ACT in a plan view. In an embodiment, the gate electrode GAT may include a metal, an alloy, a conductive metal oxide, a transparent conductive material, or the like. Examples of materials that may be used as the gate electrode GAT may include at least one of silver (Ag), an alloy containing silver, molybdenum (Mo), an alloy containing molybdenum, aluminum (Al), an alloy containing aluminum, aluminum nitride ($Al_xN_y$), tungsten (W), tungsten nitride ($W_xN_y$), copper (Cu), nickel (Ni), chromium (Cr), chromium nitride ($Cr_xN_y$), titanium (Ti), tantalum (Ta), platinum (Pt), scandium (Sc), indium tin oxide (ITO), indium zinc oxide (IZO), and the like. These may be used alone or in combination with each other.

The second insulating layer ILD2 may be disposed on the buffer layer BFR and cover the gate electrode GAT. In an embodiment, the second insulating layer ILD2 may include an inorganic insulating material. For example, examples of materials that may be used as the second insulating layer ILD2 may include at least one of silicon oxide, silicon nitride, silicon oxynitride, and the like. These may be used alone or in combination with each other.

The first connection electrode CE1 and the second connection electrode CE2 may be disposed on the second insulating layer ILD2. The first connection electrode CE1 and the second connection electrode CE2 may contact the active pattern ACT. For example, the first connection electrode CE1 and the second connection electrode CE2 may be electrically connected to parts of the active pattern ACT through contact holes penetrating the first insulating layer ILD1 and the second insulating layer ILD2. The first connection electrode CE1 and the second connection electrode CE2 may include a metal such as aluminum (Al), titanium (Ti), or copper (Cu). For example, the first connection electrode CE1 and the second connection electrode CE2 may include an alloy of the above-described metals.

The third insulating layer ILD3 may be disposed on the first connection electrode CE1 and the second connection electrode CE2. The third insulating layer ILD3 may include an organic insulating material such as polyimide and/or an inorganic insulating material such as silicon nitride or silicon oxide. The third insulating layer ILD3 may have a multilayer structure.

The pixel electrode ADE may be disposed on the third insulating layer ILD3. The pixel electrode ADE may be electrically connected to the first connection electrode CE1 or the second connection electrode CE2. For example, the pixel electrode ADE may be electrically connected to the first connection electrode CE1 or the second connection electrode CE2 through a contact hole penetrating the third insulating layer ILD3. The pixel electrode ADE may include a metal, an alloy, a conductive metal oxide, a transparent conductive material, or the like. For example, examples of materials that may be used as the pixel electrode ADE may include at least one of silver (Ag), an alloy containing silver, molybdenum (Mo), an alloy containing molybdenum, aluminum (Al), and aluminum, alloy containing aluminum nitride ($Al_xN_y$), tungsten (W), tungsten nitride ($W_xN_y$), copper (Cu), nickel (Ni), chromium (Cr), chromium nitride ($Cr_xN_y$), titanium (Ti), tantalum (Ta), platinum (Pt), scandium (Sc), indium tin oxide (ITO), indium zinc oxide (IZO), and the like. These may be used alone or in combination with each other.

The pixel defining layer PDL may be disposed on the pixel electrode ADE. In an embodiment, the pixel defining layer PDL may include an organic insulating material. A pixel opening exposing an upper surface of the pixel electrode ADE may be formed in the pixel defining layer PDL. For example, the pixel defining layer PDL may be disposed between adjacent pixel electrodes ADE.

The emission layer EL may be disposed on the pixel electrode ADE exposed through the pixel opening. In an embodiment, the emission layer EL may be separated from an emission layer of an adjacent pixel. In another embodiment, the emission layer EL may continuously extend on the pixel electrode ADE and the pixel defining layer PDL.

The common electrode CTE may be disposed on the emission layer EL. The common electrode CTE may include a conductive material such as a metal, an alloy, a conductive metal nitride, a conductive metal oxide, or a transparent conductive material. The common electrode CTE may have a single-layer structure or a multi-layer structure including conductive layers. The emission layer EL may emit light based on a voltage difference between the pixel electrode ADE and the common electrode CTE.

The encapsulation layer TFE may be disposed on the common electrode CTE. The encapsulation layer TFE may include at least one inorganic encapsulation layer and at least one organic encapsulation layer. In an embodiment, the encapsulation layer TFE may include a first inorganic encapsulation layer IL1 disposed on the common electrode CTE, an organic encapsulation layer OL disposed on the first inorganic encapsulation layer IL1, and a second inorganic encapsulation layer IL2 disposed on the organic encapsulation layer OL. The encapsulation layer TFE may prevent impurities from penetrating into the light emitting device LED.

FIG. 4 is a schematic cross-sectional view taken along line II-IT of FIG. 1, and FIG. 5 is a schematic cross-sectional view illustrating a bent state of the display device of FIG. 4.

Referring to FIGS. 4 and 5, the bending area BA of the display panel PNL may be bent along the bending axis. For example, as shown in FIG. 5, the bending area BA may be bent, and a portion of the lower surface PNL-L of the display panel PNL and another portion of the lower surface PNL-L of the display panel PNL may face each other and overlap the display area DA and the pad area PA in a plan view.

In an embodiment, the protective film PFM may overlap the display area DA and the pad area PA in a plan view. The protective film PFM may have an opening OP overlapping the bending area BA in a plan view. For example, the opening OP may pass through the protective film PFM and expose the display panel PNL in the bending area BA (e.g., expose a portion of the display panel PNL in the bending area BA). For example, the opening OP may expose a portion of the lower surface PNL-L of the display panel PNL in the bending area BA. The opening OP may prevent or reduce separation of the protective film PFM from the display panel PNL during the bending of the display panel PNL.

In an embodiment, the first adhesive layer AL1 may be disposed under the display panel PNL and the protective film PFM. The first adhesive layer AL1 may adhere the protective film PFM to the display panel PNL. In an embodiment, the first adhesive layer AL1 may be integrally formed to overlap the display area DA, the pad area PA, and the bending area BA in a plan view under the display panel PNL. Accordingly, the first adhesive layer AL1 may cover the opening OP.

In an embodiment, a portion of the first adhesive layer AL1 may be disposed in the opening OP. For example, the first adhesive layer AL1 may contact the display panel PNL in the opening OP. The first adhesive layer AL1 may contact the lower surface PNL-L of the display panel PNL exposed by the opening OP in the bending area BA. Accordingly, the first adhesive layer AL1 may adhere (or attached to) the cushion layer CL and the display panel PNL in the bending area BA.

In an embodiment, the first adhesive layer AL1 may be spaced apart from an inner surface OP-S of the opening OP in the opening OP. The first adhesive layer AL1 may not contact the inner surface OP-S of the opening OP. Accordingly, peeling of the first adhesive layer AL1 from the display panel PNL during the bending of the display panel PNL may be prevented or reduced.

The cushion layer CL may be disposed under the first adhesive layer ALL For example, the cushion layer CL may be integrally formed to overlap the display area DA, the pad area PA, and the bending area BA in a plan view under the first adhesive layer ALL The cushion layer CL may cover (e.g., entirely cover) the first adhesive layer AL1 For example, the cushion layer CL may be formed along a profile of the first adhesive layer ALL Accordingly, the cushion layer CL may cover the opening OP. In an embodiment, a portion of the cushion layer CL may be disposed within the opening OP of the protective film PFM.

In an embodiment, the first adhesive layer AL1 and the cushion layer CL may have flexibility. Accordingly, in case that the display panel PNL is bent, the first adhesive layer AL1 and the cushion layer CL having flexibility may also be bent. In case that the display panel PNL is bent, a portion of a lower surface of the first adhesive layer AL1 and another portion of the lower surface of the first adhesive layer AL1 may face each other, and a lower surface of a lower surface of the cushion layer CL and another portion of the lower surface of the cushion layer CL may face each other.

Accordingly, even after the display panel PNL is bent, the first adhesive layer AL1 and the cushion layer CL may partially fill the opening OP. The first adhesive layer AL1 and the cushion layer CL may reduce an empty space of the display device DD, which is formed by the opening OP. Accordingly, durability of the display panel PNL overlapping the bending area BA in a plan view may be improved. The first adhesive layer AL1 and the cushion layer CL disposed in the opening OP may protect the display panel PNL from external impact.

In an embodiment, a thickness of the first adhesive layer AL1 may be in a range of about 10 micrometers to about 50 micrometers. For example, the thickness of the first adhesive layer AL1 may be in a range of about 30 micrometers to about 50 micrometers. Also, in an embodiment, a thickness of the cushion layer CL may be in a range of about 50 micrometers to about 90 micrometers. For example, the thickness of the cushion layer CL may be in a range of about 70 micrometers to about 90 micrometers. In case that the thicknesses of the first adhesive layer AL1 and the cushion layer CL satisfy the above range, deformation of the display device DD may be prevented or reduced even in case that each of the first adhesive layer AL1 and the cushion layer CL is bent.

In an embodiment, a second adhesive layer AL2 may be disposed below the cushion layer CL. The second adhesive layer AL2 may overlap the pad area PA in a plan view. In an embodiment, as shown in FIG. 4, the second adhesive layer AL2 may overlap the pad area PA and partially overlap the bending area BA in a plan view. However, the disclosure is not limited thereto, and the second adhesive layer AL2 may overlap (e.g., entirely overlap) the pad area PA in a plan view. In FIG. 5, in case that the display panel PNL is bent, the second adhesive layer AL2 may face the metal layer ML and overlap the metal layer ML in a plan view.

In an embodiment, in case that the display panel PNL is bent, the second adhesive layer AL2 may contact the metal layer ML. Accordingly, the second adhesive layer AL2 may adhere (or attached to) the metal layer ML and the cushion layer CL under the metal layer ML. In case that the display panel PNL is bent, an empty space may not be formed between the overlapping metal layer ML and the protective film PFM. Accordingly, a separate layer may not be required to fill an empty space between the metal layer ML and the protective film PFM overlapping each other in a plan view in case that the display panel PNL is bent.

In an embodiment, the second adhesive layer AL2 may include pressure sensitive adhesive (PSA), optically clear adhesive (OCA), optically clear resin (OCR), or the like. In an embodiment, a thickness of the second adhesive layer AL2 may be in a range of about 10 micrometers to about 50 micrometers. For example, the thickness of the second adhesive layer AL2 may be in a range of about 30 micrometers to about 50 micrometers.

A bending protection layer BPL may be disposed on the bending area BA of the display panel PNL. For example, the bending protection layer BPL may be disposed on the upper surface PNL-U of the display panel PNL and may cover the bending area BA. In an embodiment, as shown in FIG. 4, a portion of the bending protection layer BPL may overlap a portion of the display area DA and/or the pad area PA of the display panel PNL in a plan view. For example, the portion of the bending protection layer BPL may extend from the bending area BA toward the portion of the display area DA and/or the pad area PA of the display panel PNL. However, the disclosure is not limited thereto, and the bending protection layer BPL may overlap (e.g., entirely overlap) only with the bending area BA in a plan view.

The bending protection layer BPL may protect the bending area BA of the display panel PNL. For example, the bending protection layer BPL may protect a conductive layer in the bending area BA of the display panel PNL. Wires for transmitting a driving signal to the display panel PNL may be disposed on the conductive layer. In case that the display device DD is bent according to an arrangement of the bending protection layer BPL, a stress neutral plane (e.g., a plane in which a tensile stress is the same as a compressive stress) may be adjusted and the tensile stress applied to the conductive layer may be minimized. Also, the bending protection layer BPL may protect the bending area BA of the display panel PNL from static electricity introduced from outside.

In an embodiment, as shown in FIGS. 4 and 5, the anti-reflection layer POL and the bending protection layer BPL disposed on the upper surface PNL-U of the display panel PNL may contact each other. However, the disclosure is not limited thereto, and in another embodiment, the anti-reflection layer POL and the bending protection layer BPL may be spaced apart from each other. In case that the anti-reflection layer POL or the bending protection layer BPL is formed on the display panel PNL, defects may be reduced.

The window WIN may overlap the display area DA in a plan view. For example, the window WIN may not overlap the bending area BA in a plan view. In case that the window WIN extends to overlap the bending area BA in a plan view, a risk of damage to the window WIN may increase as a portion not supported by lower structures (e.g., the anti-reflection layer POL, the display panel PNL, the metal layer ML, etc.) increases. Accordingly, the window WIN may be extended by a length overlapping the display area DA in a plan view, as shown in FIG. 4, and the risk of damage may be reduced. However, the disclosure is not limited thereto, and in another embodiment, a portion of the window WIN may extend to overlap the bending area BA in a plan view.

In an embodiment, a length of the window protective layer WPL in the first direction DR1 may be greater than a length of the window WIN in the first direction DR1. For example, the window protective layer WPL may include a portion overlapping the window WIN and a portion not overlapping the window WIN in a plan view. However, the disclosure is not limited thereto, and in another embodiment, the window protective layer WPL may overlap (e.g., entirely overlap) the window WIN in a plan view.

Figure 6:
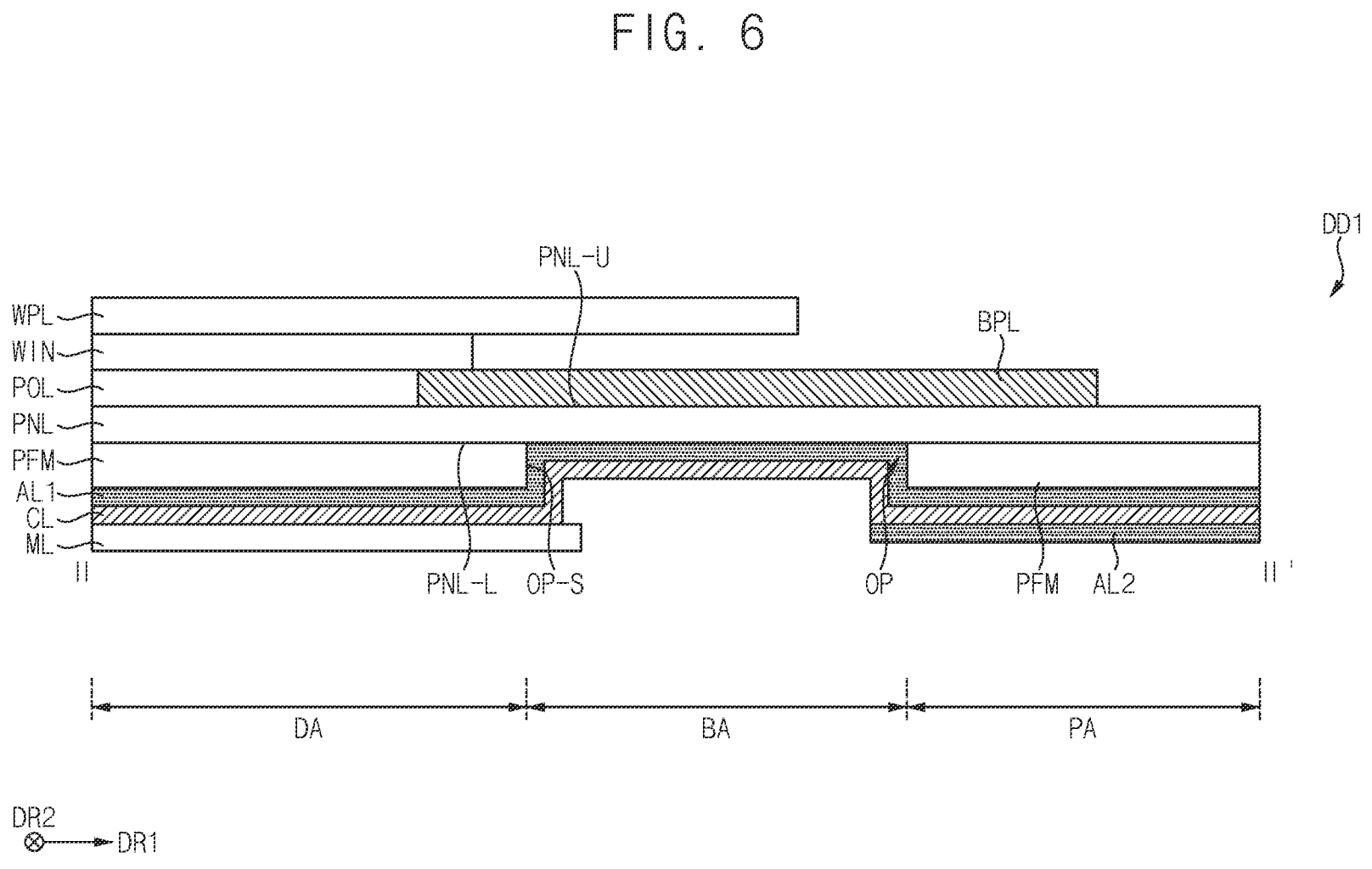
Figure 7:
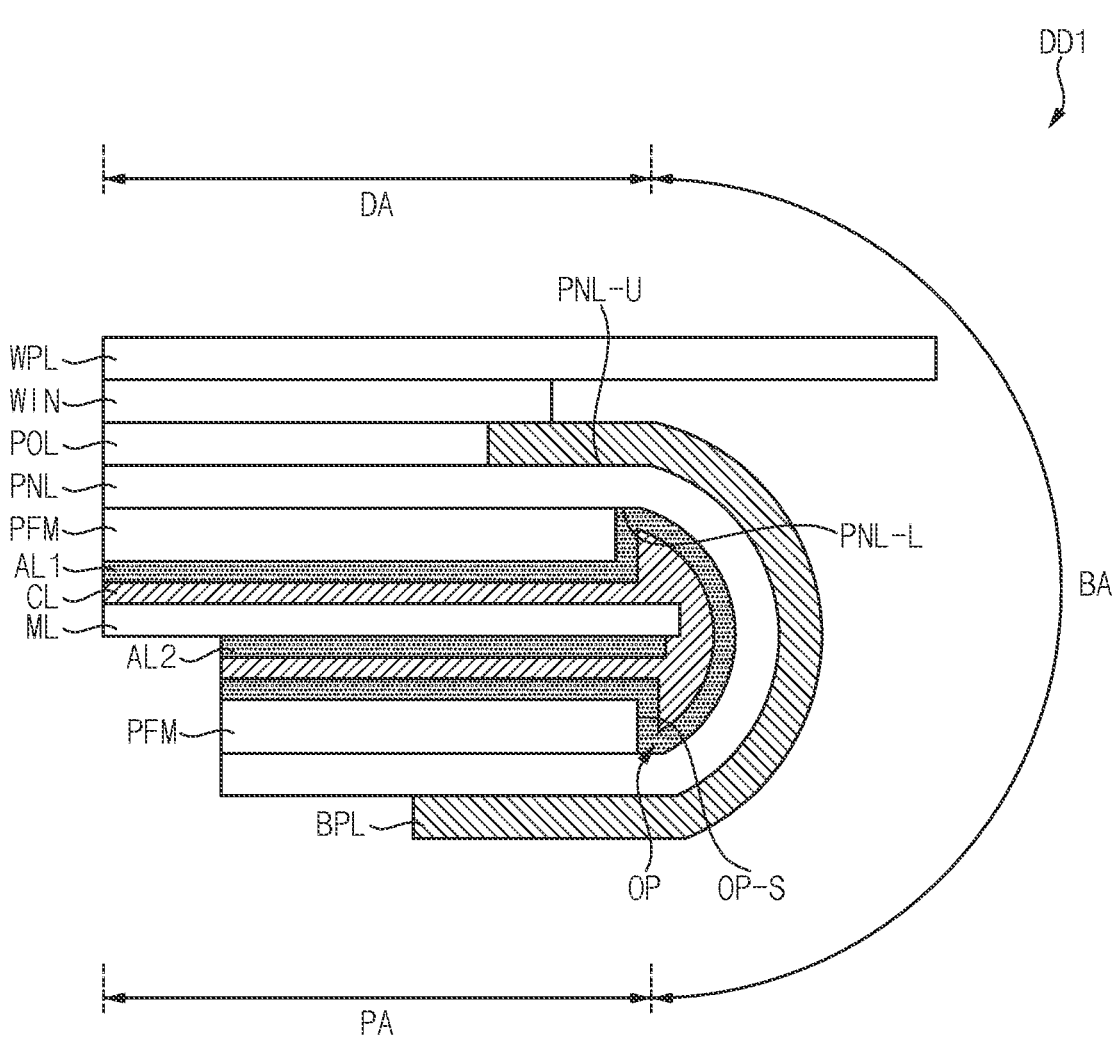
FIG. 7 is a schematic cross-sectional view illustrating a bent state of the display device of FIG. 6.
Figure 7:
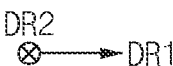

FIG. 6 is a schematic cross-sectional view illustrating a display device according to another embodiment, and FIG. 7 is a schematic cross-sectional view illustrating a bent state of the display device of FIG. 6. For example, FIG. 6 may correspond to the cross-sectional view of FIG. 4.

Referring to FIGS. 6 and 7, a display device DD1 according to another embodiment may include the display panel PNL, the anti-reflection layer POL, the bending protection layer BPL, the window WIN, the window protective layer WPL, the protective film PFM, the first adhesive layer AL1, the cushion layer CL, the metal layer ML, and the second adhesive layer AL2. The display device DD1 of FIGS. 6 and 7 is different from the display device DD described with reference to FIGS. 4 and 5 at least in that the first adhesive layer AL1 and the cushion layer CL are filled in the opening OP. Therefore, repeated descriptions of the same constituent elements are omitted or simplified.

In an embodiment, the first adhesive layer AL1 may contact the inner surface OP-S of the opening OP of the protective film PFM. For example, as shown in FIG. 6, the first adhesive layer AL1 may cover (e.g., entirely cover or fill) the inner surface OP-S of the opening OP and the lower surface PNL-L of the display panel PNL in the opening OP. The first adhesive layer AL1 may be extended in the opening OP, from an inner surface of the opening OP to another inner surface of the opening OP along the lower surface PNL-L of the display panel PNL.

The cushion layer CL may be formed along a profile of the first adhesive layer AL1 Thus, the cushion layer CL may also cover (e.g., entirely cover) the inner surface OP-S of the opening OP and the lower surface PNL-L of the display panel PNL. The cushion layer CL may be extended in the opening OP, from an inner surface of the opening OP, to another inner surface of the opening OP along the lower surface PNL-L of the display panel PNL.

As shown in FIG. 7, in case that the display panel PNL is bent, the first adhesive layer AL1 and the cushion layer CL may fill the opening OP. For example, in case that the display panel PNL is bent, the first adhesive layer AL1 and the cushion layer CL may substantially fill all of the empty space of the opening OP. Since the first adhesive layer AL1 and the cushion layer CL fill the opening OP, durability of the display panel PNL overlapping the bending area BA in a plan view may be further improved.

Figure 8:
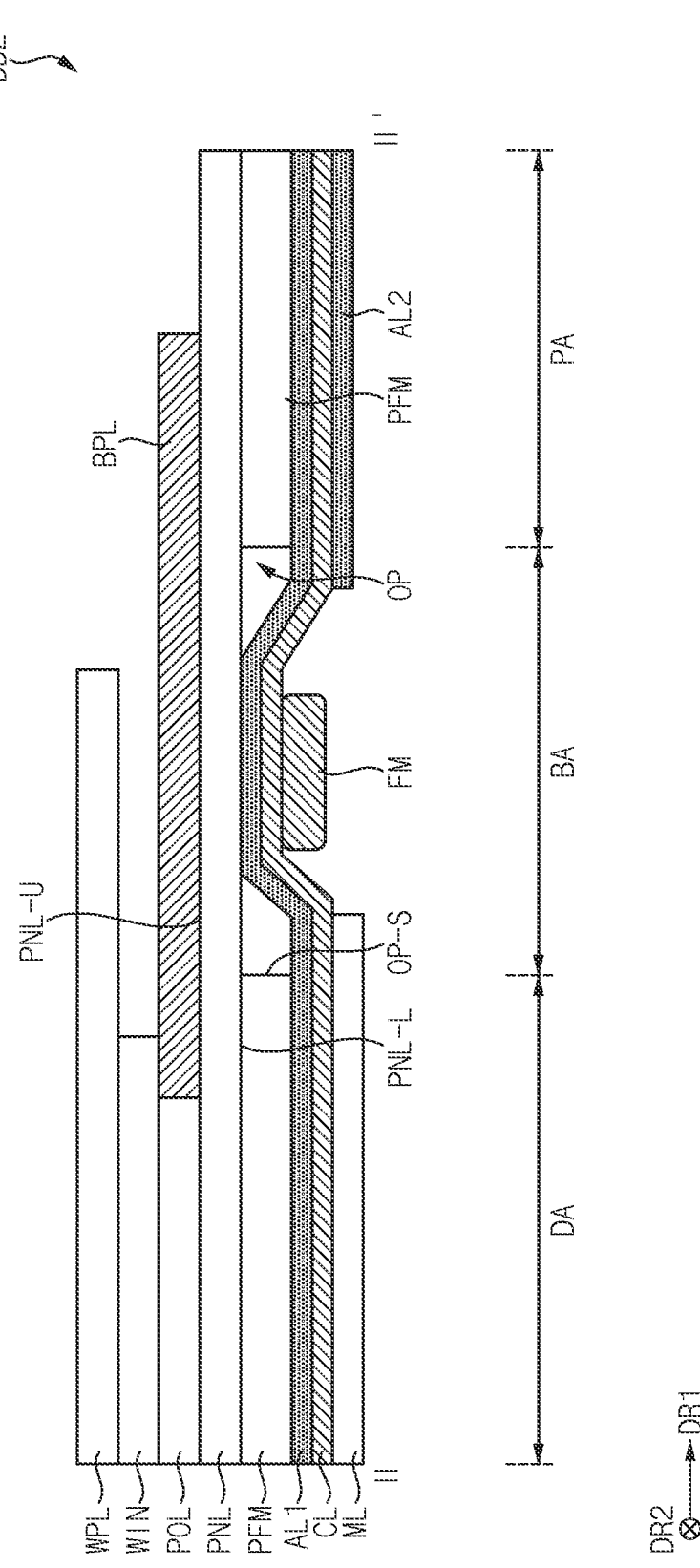
FIG. 8 is a schematic cross-sectional view of a display device according to still another embodiment.
Figure 9:
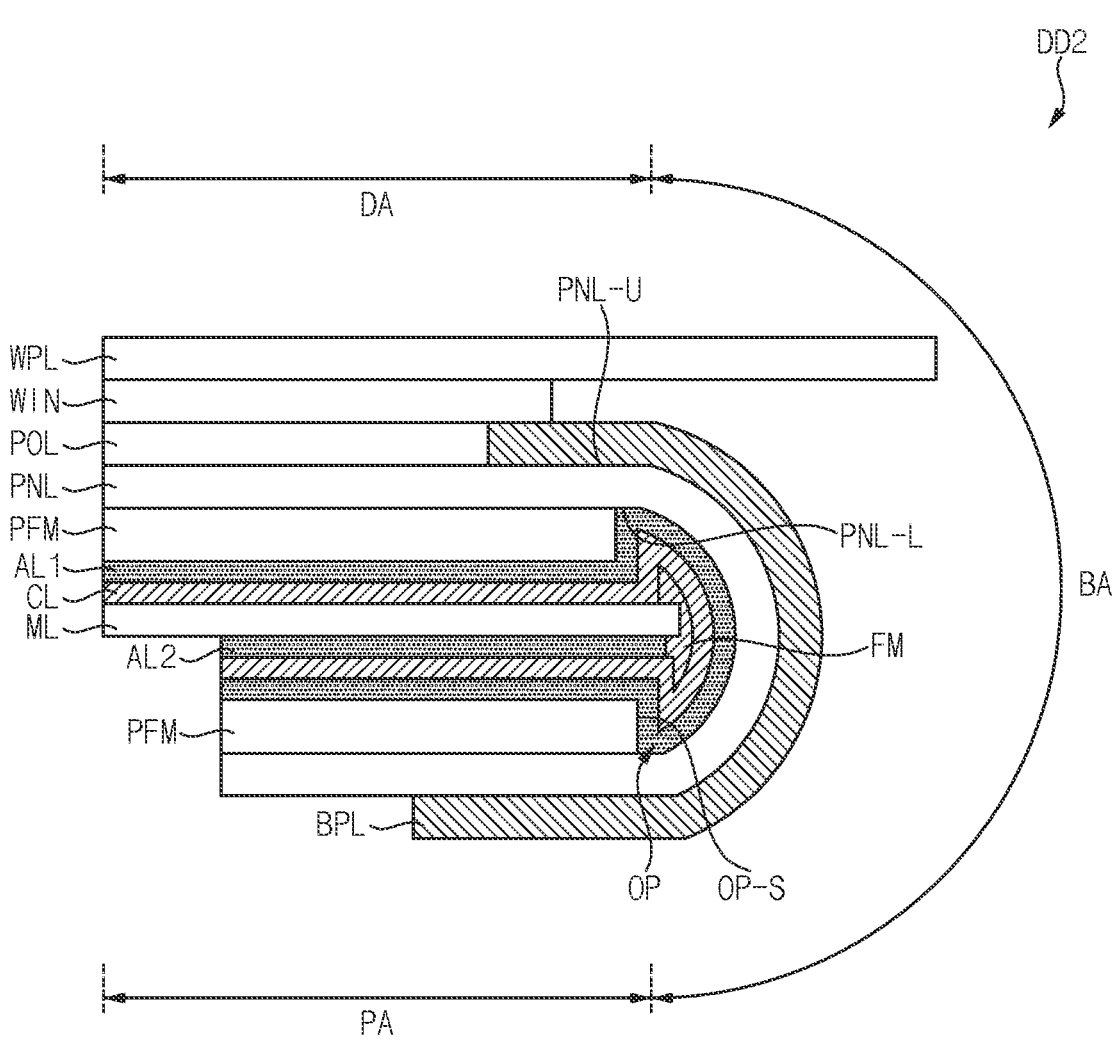
FIG. 9 is a schematic cross-sectional view of a bent state of the display device of FIG. 8.
Figure 9:
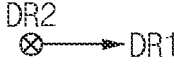

FIG. 8 is a schematic cross-sectional view of a display device according to still another embodiment, and FIG. 9 is a schematic cross-sectional view of a bent state of the display device of FIG. 8. For example, FIG. 8 may correspond to the cross-sectional view of FIG. 4.

Referring to FIGS. 8 and 9, a display device DD2 according to still another embodiment may include the display panel PNL, the anti-reflection layer POL, the bending protection layer BPL, the window WIN, the window protective layer WPL, the protective film PFM, the first adhesive layer AL1, the cushion layer CL, the metal layer ML, the second adhesive layer AL2, and a filling member FM. The display device DD2 of FIGS. 8 and 9 is different from the display device DD described with reference to FIGS. 4 and 5 at least in that the filling member FM is disposed in the bending area BA. Therefore, repeated descriptions of the same constituent elements are omitted or simplified.

The filling member FM may be disposed under the cushion layer CL and may overlap the bending area BA in a plan view. For example, the filling member FM may overlap the opening OP of the protective film PFM in a plan view.

In an embodiment, the filling member FM may include at least one of acrylic resin, polyurethane, thermoplastic polyurethane, latex, polyurethane foam, polystyrene foam, and the like. The filling member FM may have a foam shape or a gel shape. In an embodiment, the filling member FM and the cushion layer CL may include a same material.

As shown in FIG. 9, in case that the display panel PNL is bent, the filling member FM may partially fill the opening OP. Thus, a shape of the filling member FM may be deformed. Accordingly, shapes of the first adhesive layer AL1 and the cushion layer CL may be modified, and the first adhesive layer AL1 and the cushion layer CL may contact the inner surface OP-S in the opening OP. For example, in case that the display panel PNL is bent, the first adhesive layer AL1, the cushion layer CL, and the filling member FM may substantially fill all of the empty space of the opening OP. Since the first adhesive layer AL1, the cushion layer CL, and the filling member FM fill the opening OP, durability of the display panel PNL overlapping the bending area BA in a plan view may be further improved.

According to embodiments, the display device may include the display panel PNL, the protective film PFM disposed under the display panel PNL, the first adhesive layer AL1 disposed under the protective film PFM, and the cushion layer CL disposed under the adhesive layer ADL1. The protective film PFM may have the opening OP exposing a portion of the lower surface PNL-L of the display panel PNL. Each of the first adhesive layer AL1 and the cushion layer CL may be integrally formed to overlap the display area DA, the bending area BA, and the pad area PA in a plan view, and may cover the opening OP. For example, a portion of the first adhesive layer AL1 and a portion of the cushion layer CL may be disposed in the opening OP in the bending area BA. Accordingly, durability of the display panel PNL in the bending area BA may be improved, and durability of the display device may be improved.

Since the first adhesive layer AL1 and the cushion layer CL cover the opening OP in the bending area BA, a separate process for filling the opening OP may not be required. Thus, efficiency of the manufacturing process of the display device may be improved.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display panel including:
  a display area;
  a pad area spaced apart from the display area; and
  a bending area located between the display area and the pad area and bent from the display area;
a protective film disposed under the display panel, having an opening exposing a portion of a lower surface of the display panel, and overlapping the display area and the pad area in a plan view;
a first adhesive layer disposed under the display panel and the protective film, extending continuously from the display area to the pad area to overlap the display area, the pad area, and the bending area in a plan view, covering the opening and directly contacting the display panel in the bending area; and
a cushion layer disposed under the first adhesive layer, extending continuously from the display area to the pad area to overlap the display area, the pad area, and the bending area in a plan view, and covering the opening.

2. The display device of claim 1, wherein the opening overlaps the bending area in a plan view.

3. The display device of claim 1, wherein a portion of the first adhesive layer is disposed in the opening.

4. The display device of claim 1, wherein a portion of the cushion layer is disposed in the opening.

5. The display device of claim 1, wherein the first adhesive layer contacts the lower surface of the display panel in the opening.

6. The display device of claim 5, wherein the first adhesive layer is spaced apart from an inner surface of the opening.

7. The display device of claim 5, wherein the first adhesive layer contacts an inner surface of the opening.

8. The display device of claim 7, wherein the first adhesive layer entirely covers the inner surface of the opening and the lower surface of the display panel in the opening.

9. The display device of claim 1, wherein the first adhesive layer and the cushion layer have flexibility.

10. The display device of claim 1, wherein a thickness of the cushion layer is in a range of about 50 micrometers to about 90 micrometers.

11. The display device of claim 1, wherein a thickness of the first adhesive layer is in a range of about 10 micrometers to about 50 micrometers.

12. The display device of claim 1, further comprising:
a second adhesive layer disposed under the cushion layer and overlapping the pad area in a plan view.

13. The display device of claim 12, wherein a thickness of the second adhesive layer is in a range of about 10 micrometers to about 50 micrometers.

14. The display device of claim 12, further comprising:

a metal layer disposed under the cushion layer and overlapping the display area in a plan view.

15. The display device of claim 14, wherein the second adhesive layer contacts the metal layer in a bent state of the bending area.

16. The display device of claim 1, further comprising:

a filling member disposed under the cushion layer and overlapping the bending area in a plan view.

17. The display device of claim 16, wherein the filling member overlaps the opening in a plan view.

18. The display device of claim 16, wherein the filling member and the cushion layer include a same material.

19. The display device of claim 1, further comprising:

a pad part disposed on an upper surface opposite to the lower surface of the display panel and overlapping the pad area in a plan view.

20. The display device of claim 19, wherein the display panel includes:

a transistor electrically connected to the pad part;

a pixel electrode disposed on the transistor and electrically connected to the transistor;

an emission layer disposed on the pixel electrode;

a common electrode disposed on the emission layer; and an encapsulation layer disposed on the common electrode and including at least one inorganic encapsulation layer and at least one organic encapsulation layer.

\* \* \* \* \*